United States Patent

Berg et al.

(10) Patent No.: US 6,723,928 B1
(45) Date of Patent: Apr. 20, 2004

(54) TERMINAL PINS MOUNTED IN FLEXIBLE SUBSTRATES

(75) Inventors: Paul Christopher Berg, Batavia, IL (US); Harry N. Etters, Plainfield, IL (US); Robert M. Fuerst, Maple Park, IL (US); Todd A. Hester, Montgomery, IL (US); Fred Love Krehbiel, Chicago, IL (US)

(73) Assignee: Molex Incorporated, Lisle, IL (US)

( * ) Notice: Subject to any disclaimer, the term of this patent is extended or adjusted under 35 U.S.C. 154(b) by 867 days.

(21) Appl. No.: 08/939,569

(22) Filed: Sep. 29, 1997

(51) Int. Cl.[7] .................... H01R 12/04; H05K 1/11
(52) U.S. Cl. .................... 174/267; 439/77; 439/82; 174/254
(58) Field of Search ................ 439/67, 77, 75, 439/82, 733.1, 751; 174/254, 262, 266, 267; 361/749

(56) References Cited

U.S. PATENT DOCUMENTS

| | | | | |
|---|---|---|---|---|
| 4,544,802 A | * | 10/1985 | Siden | 174/68.5 |
| 4,909,746 A | * | 3/1990 | Scholz | 439/82 |
| 4,970,624 A | | 11/1990 | Arneson et al. | 361/749 |
| 5,141,455 A | | 8/1992 | Ponn | 439/620 |
| 5,242,318 A | | 9/1993 | Plass | 439/620 |
| 5,266,054 A | | 11/1993 | Duncan et al. | 439/620 |
| 5,384,435 A | | 1/1995 | Fuerst et al. | 174/262 |
| 5,456,616 A | | 10/1995 | Fuerst et al. | 439/620 |
| 5,717,556 A | * | 2/1998 | Yanagida | 361/803 |

* cited by examiner

Primary Examiner—Hung V. Ngo
(74) Attorney, Agent, or Firm—Stacey E. Caldwell

(57) ABSTRACT

An electronic device includes a flat flexible dielectric substrate less than 0.050 inch thick and having a generally round hole of a given diameter. A substantially square or polygonal terminal pin is inserted into the round hole in the substrate. The pin has a given cross-dimension between opposite diametral corners thereof greater than the diameter of the round hole. The difference between the cross-dimension of the pin and the diameter of the round hole is on the order of 7% to 67% of the diameter of the hole.

16 Claims, 3 Drawing Sheets

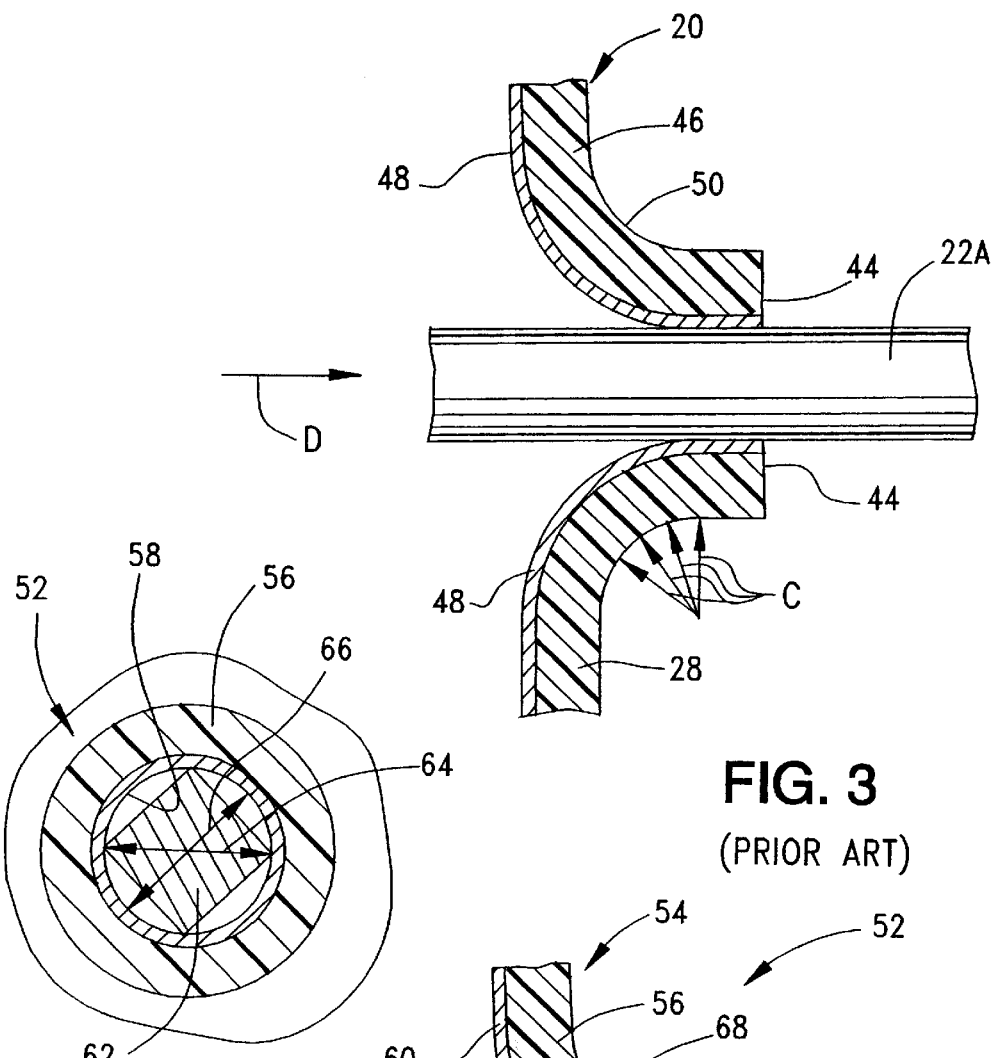
FIG. 3
(PRIOR ART)
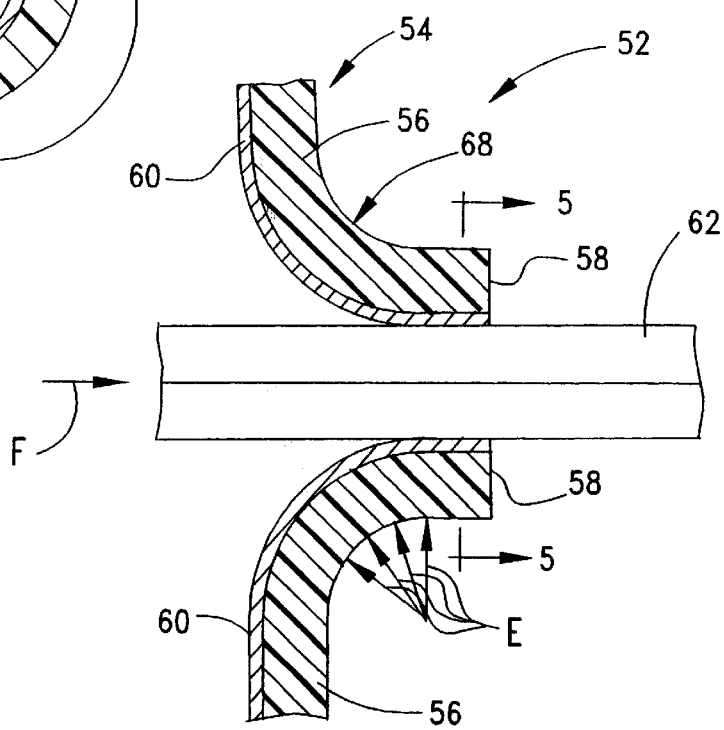
FIG. 5
FIG. 4

TERMINAL PINS MOUNTED IN FLEXIBLE SUBSTRATES

FIELD OF THE INVENTION

This invention generally relates to the art of electrical connectors and, particularly, to an electronic device wherein terminal pins are electrically coupled through holes in a flat flexible circuit or substrate.

BACKGROUND OF THE INVENTION

A variety of electrical connectors are designed for utilization with a flat flexible circuit which may be mounted directly on the connector or connected in circuit with terminal pins on the connector. Generally, a flat flexible circuit includes a flat flexible dielectric substrate having one or more holes therein for receiving one or more terminal pins. A ductile conductive film or other circuit trace system is deposited on the substrate in an area at least about the hole or holes. The terminal pins are inserted into the holes in the substrate to establish electrical and mechanical connections between the pins and the flat flexible circuit. Normally, each hole is smaller in diameter than a respective pin. Alternatively, the pin may be punched through the flat flexible circuit to establish the electrical and mechanical connection therewith.

In order to assure good electrical and mechanical connections in these types of electronic devices or electrical connectors, solder or other adhesives often are used. For instance, in U.S. Pat. No. 4,970,624, dated Nov. 13, 1990 and assigned to the assignee of the present invention, uni-axial adhesive is deposited on the flat flexible circuit about the hole which is penetrated by the terminal pin. The adhesive includes a non-conductive base incorporating randomly spaced conductive particles. When the terminal pin is forced through the adhesive, a portion of the adhesive is carried with the terminal pin between the pin and the flat flexible circuit. The carried portion of the adhesive is compressed for establishing contact between the conductive particles and, thereby, conductivity between the terminal pin and the flat flexible circuit, leaving the adhesive other than that portion in a non-conductive state. Such adhesives often are called "Z-axis" adhesives. These adhesives were developed to replace soldering techniques which require specific temperature resistant components and substrates.

Conductive adhesives are used in other applications involving flat flexible circuits. For instance, in U.S. Pat. No. 5,456,616, dated Oct. 10, 1995 and assigned to the assignee of the present invention, the connector housing is fabricated of a die cast metallic material, such as of magnesium, aluminum or the like. The ductile film on the flat flexible circuit is fabricated of a different metallic material, such as copper or the like and, in fact, may be plated with still a different metallic material such as a tin/lead alloy. The conductive film on the flat flexible circuit acts as a ground plane against the rear face of the connector housing. The housing has a plurality of pins which project through holes in the flat flexible circuit. Using a "Z-axis" adhesive between the housing pins and the flat flexible circuit not only is expensive, as described above, but the conductive interface between the different metal components is limited to the areas of pressure. Consequently, that patent teaches the use of an omni-directional conductive adhesive deposited on the conductive film over the areas of the holes therein, the conductive adhesive expanding the conductive interface between the metal housing and the metal ground plane defined by the conductive film.

Although such uses of conductive adhesives, whether the adhesives are Z-axis adhesives or omni-directional adhesives, serve their intended purposes in certain applications, they are relatively expensive both in the cost of the adhesives as well as their methods of use. In addition, the use of either type of conductive adhesive is costly in terms of secondary operations and costs associated with the metal particles, not to mention the problem of clogging adhesive dispensers by the metallic particles.

Because of the problems associated with the use of conductive adhesives, a unique system was devised as disclosed in U.S. Pat. No. 5,384,435, dated Jan. 24, 1995 and assigned to the assignee of the present invention. That patent solves the problems with conductive adhesives by establishing an electrical connection directly between the terminal pin and the flat conductor on the flat flexible substrate by controlling various parameters between the pin and the substrate. In the system of the '435 patent, the terminal pin is round in cross-section, and the round pin is inserted into a round hole in the flat flexible substrate. Although this system has proven quite effective, there continue to be a need for further improvements, and the present invention is directed to that end.

For instance, it has been found that a square cross-sectional pin can improve the column strength of the terminal pin to reduce the possibility of buckling of the pin in the mating direction (i.e. axially of the pin), without changing the pitch or spacing between the pins in a connector arrangement. In other words, if a round pin were to have a diameter equal to the cross-dimension between opposite diametral corners of a square pin, such large round pins would of necessity increase the pitch or spacing between adjacent pins and, therefore, increase the size of the overall connector. On the other hand, square pins can create problems by causing tearing of the hole in the substrate unless a particular dimensional relationship exists between the square pins and the round holes in the substrate. The present invention is directed to solving these problems or dilemmas.

SUMMARY TO THE INVENTION

An object, therefore, of the invention is to provide a new and improved system for mounting electrical terminals, such as terminal pins, in a flat flexible substrate or flexible circuit.

In the exemplary embodiment of the invention, an electronic device includes a flat flexible dielectric substrate or circuit which is less than 0.050 inch thick. The substrate has a generally round hole of a given diameter. Typically, a ductile conductive film is deposited on the substrate in an area at least about the hole. A substantially square terminal pin is inserted into the hole in the substrate. The pin has a given cross-dimension between opposite diametral corners thereof greater than the diameter of the hole. The difference between the cross-dimension of the pin and the diameter of the hole is on the order of 7% to 67% of the diameter of the hole. These parameters establish a good connection between the square pin and the conductive film on the flexible substrate without tearing the flexible substrate.

As disclosed herein, the hole in the substrate can be prepunched or drilled. The substrate may be fabricated of a material such a polyimide, although other materials as polyester and the like are appropriate. The ductile conductive film may be of copper or other conductive thick film material. It is contemplated that the terminal pin and the ductile conductive film both can be plated with a common plating material. In one embodiment of the invention, the plating material is a tin/lead alloy.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 3 is an enlarged section through an interconnection between a terminal pin and a flat flexible circuit according to a system of the prior art;

FIG. 4 is an enlarged section through an interconnection between a terminal pin and a flat flexible circuit according to the invention;

FIG. 5 is a section taken generally along line 5—5 in FIG. 4, and

DETAILED DESCRIPTION OF THE PREFERRED EMBODIMENT

Figure 1:
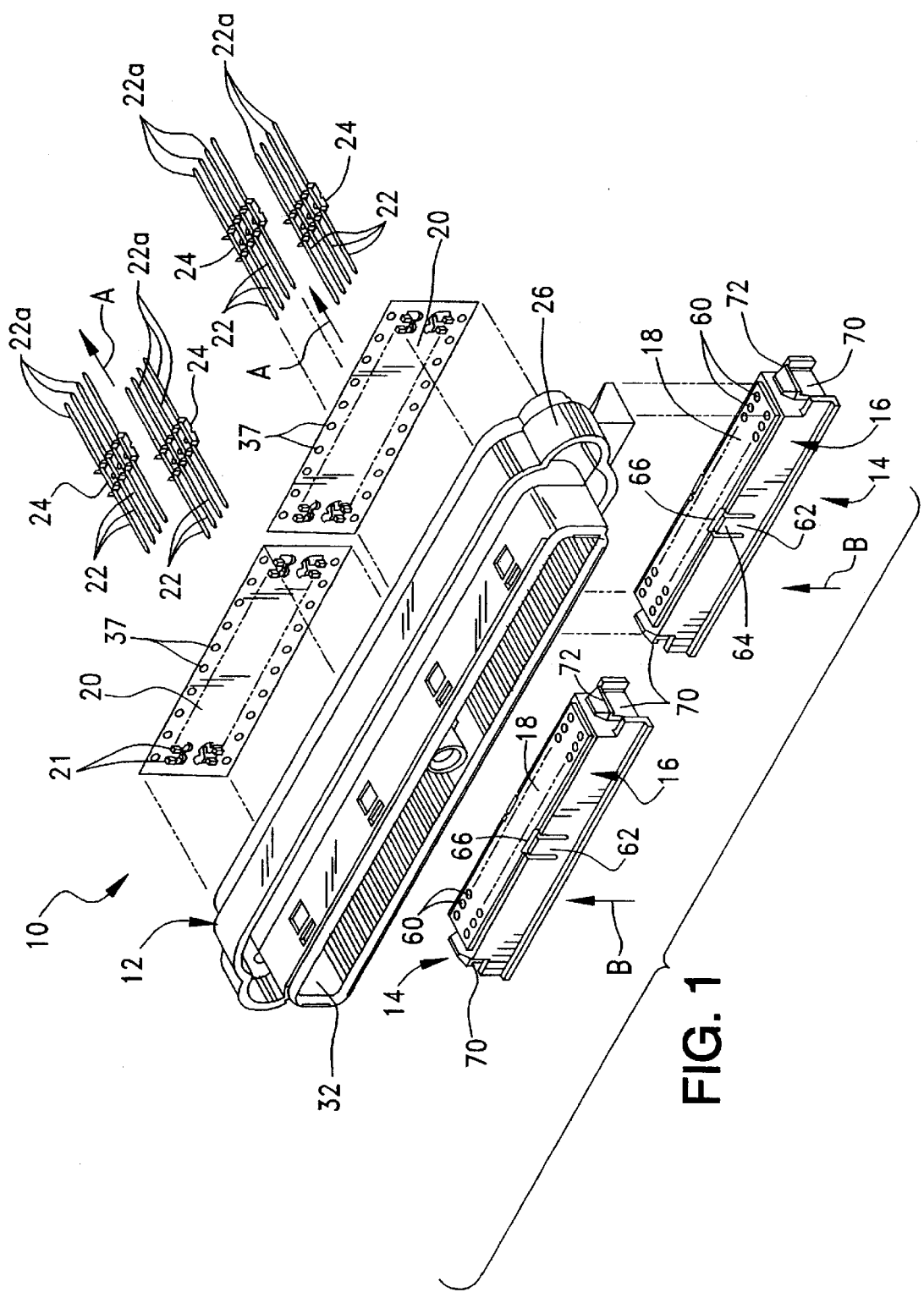
FIG. 1 is an exploded perspective view of a multi-terminal filtered electrical connector assembly incorporating the invention.

Referring to the drawings in greater detail, and first to FIG. 1, the invention may be incorporated in a multi-terminal filtered electrical connector assembly, generally designated 10. A pair of flexible capacitor filter circuits, generally designated 20, are mounted to the rear of connector 12, as described in greater detail hereinafter. A plurality of terminals 22 are assembled, through flexible capacitor filter circuits 20, onto connector 12 when the flexible circuit is pressed over the pins in the direction of arrows "A". Each flexible capacitor filter circuit has a plurality of chip capacitors 21 operatively associated with the terminals passing therethrough. Each terminal 22 includes a tail portion 22a. For illustration purposes, FIG. 1 shows groups of terminals 22 retained on bandolier holders 24 which are used primarily for handling the terminals during the plating process. Although only sixteen terminals are shown in groups of four, connector 12 can mount as many as 80 terminals and similarly configured connector designs can mount 200 or more terminals.

Figures 2, 6:
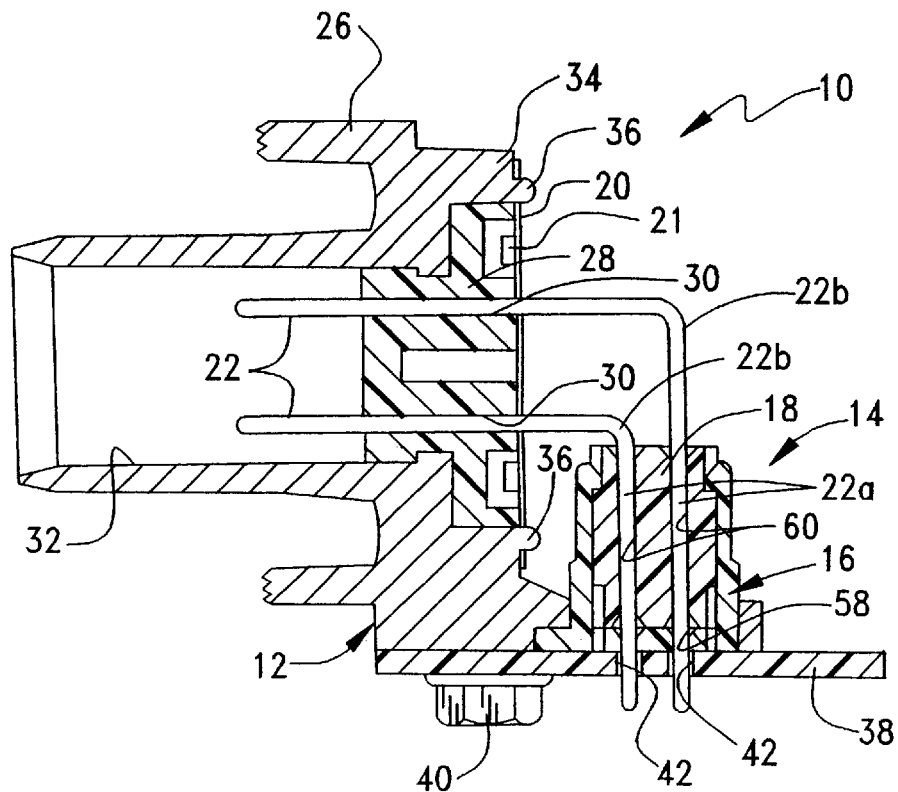
FIG. 2 is a vertical section, on an enlarged scale, through the connector assembly and with the assembly mounted to a printed circuit board.
FIG. 6 is a section similar to that shown in FIG. 5 according to an alternate embodiment of the invention.

Referring to FIG. 2 in conjunction with FIG. 1, connector 12 includes a housing 26 having an injection molded dielectric insert 28. The housing, through insert 28, includes a plurality of through passageways 30 for receiving terminals 22 whereby forward mating ends of the terminals are exposed in a cavity 32 of the housing. The cavity is provided for receiving a complementary electrical connector assembly (not shown) which have female terminals for interengagement with terminals 22. Housing 26 defines a rear face 34 thereof, with a plurality of mounting pins 36 projecting from the rear face for insertion into mounting holes 37 in flexible capacitor filter circuits 20 to mount the circuits to the rear of the housing and establish electrical contact between the housing and the flexible circuits. Housing 26 is preferably a die cast housing but may be fabricated also of plated plastic or the like.

Still referring to FIG. 2 in conjunction with FIG. 1, it can be seen that connector 12, particularly housing 26, is constructed to provide a right angle connector mountable to a printed circuit board 38, with terminals 22 extending through passageways 30 generally parallel to the printed circuit board. It can be seen that terminals 22 are bent at right angles, as at 22b, so that tail portions 22a of the terminals extend perpendicular to printed circuit board 38 for insertion into appropriate holes 42 in the circuit board for interconnection to appropriate circuit traces on the board or in the holes. Terminals 22 may also be provided in a straight or vertical orientation to provide an in-line or vertical connector mountable to printed circuit board 38.

Referring to FIG. 3, a terminal pin 22A is inserted through a hole 44 in flat flexible circuit 20. This system is in accordance to the prior art as shown in the aforementioned U.S. Pat. No. 5,384,435, and hole 44 is round and pin 22A is round in cross-section. The flat flexible circuit includes a flat flexible dielectric substrate 46 having a ductile conductive film 48 thereon. Hole 44 initially is prepunched in the circuit. Substrate 46 is less than 0.050 inch thick. Round terminal pin 22A is inserted through hole 44 to establish an electrical connection with conductive film 48.

The prior art system of FIG. 3 contemplates the use of a principle which may be called a "controlled meniscus" as indicated at 50 in FIG. 3. In other words, in order to eliminate the use of solder, adhesives, epoxies and the like, a particular interference is established between round terminal pin 22A and flat flexible circuit 20 in curved area 50 which, in essence, is a deformed peripheral area of the circuit which applies normal forces to the terminal pin in the direction of arrows "C" when the pin is inserted in the direction of arrow "D". It was found that this area and the interference forces are controlled by controlling the relative diameters of round terminal pin 22A and round hole 44. In actual practice, it was found that good electrical connections could be maintained when the difference between the diameter of terminal pin 22A and the diameter of hole 44 was on the order of 5% to 50% of the diameter of the hole. This may be termed the "interference" parameter.

The prior art system of FIG. 3 showed that secondary operations such as soldering the terminal pin to the flat conductor of the flat flexible circuit, or using epoxy or other adhesives between the pin and the flexible circuit can be completely eliminated and still maintain a good electrical connection between the pin and the flat conductor (film) of the flexible circuit. However, the invention as shown in FIG. 4 is still a further improvement on these concepts.

More particularly, it has been found that the column strength of the terminal pin can be significantly increased without increasing the pitch or spacing between a plurality of terminal pins, by using terminal pins that are square in cross-section. However, square pins heretofore have caused tearing problems at the corners of the square configuration because of the geometry of the pin in relationship to the diameter of the hole and the alignment therebetween. The present invention solves this problems in a system described below. FIGS. 4 and 5 show an electronic device or interconnection, generally designated 52, as might be applied with terminal pins in connectors such as connector 10 in FIGS. 1 and 2. In this system a flat flexible circuit, generally designated 54, again includes a flat flexible dielectric substrate 56 with a generally round hole 58 and with ductile conductive film 60 thereon. A square terminal pin 62 is inserted through hole 58 in substrate 56 to establish an electrical connection with conductive film 60. The square pin has a given cross-dimension between opposite diametral corners thereof greater than that of the hole. Specifically, the difference between the cross-dimension of the square pin and the diameter of the round hole is on the order of 7% to 67% of the diameter of the hole.

The above relationship is shown best in FIG. 5 wherein the cross-dimension between opposite diametral corners of square pin 62 is represented by double-headed arrow 64. The diameter of round hole 58 in flexible substrate 56 is represented by double-headed arrow 66. Therefore, the difference between dimension 64 and dimension 66 is on the order of 7% to 67%. These parameters represent the "controlled meniscus" as indicated at 68 (FIG. 4) where the deformed peripheral area of the flexible circuit applies normal forces to the square terminal pin in the direction of arrows "E" when the pin is inserted in the direction of arrow "F".

Conductive film 60 and the plating of terminal pin 62 may be of similar or dissimilar materials. For instance, conductive film 60 may be of copper material and the terminal pin can be plated with a tin or tin/lead alloy. The copper film, itself, can be plated with a tin/lead alloy, and the terminal pin can be plated with a similar tin or tin/lead alloy to form a similar metal interface, or the pin can be plated with a dissimilar metal. Of course, other alloys, such as nickel can be used. Substrate 56 may be of various materials, such as a polyimide material or a polyester material. It also should be understood that the corners of pin 62 can be rounded to further eliminate tearing of the substrate due to alignment issues associated with the assembly of the flex circuit to the connector, as shown in FIG. 6.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An electronic device, comprising:
 a flat flexible dielectric substrate less than 0.050 inch thick and having a generally round hole of a given diameter;
 a substantially square terminal pin having rounded corners inserted into the round hole in the substrate, the square pin having a given cross-dimension between opposite corners thereof greater than the diameter of the round hole; and
 wherein the difference between the cross-dimension of the square pin and the diameter of the round hole is on the order of 7% to 67% of the diameter of the hole
 and wherein an improved electrical and mechanical interface is created between the terminal pin and the flat flexible substrate in the area about said hole such that a deformed peripheral area of the flat flexible substrate applies normal forces to the square pin.

2. The electronic device of claim 1, including a ductile conductive film on the substrate in an area at least about said hole.

3. The electronic device of claim 1 wherein said hole in the substrate is a prepunched or drilled hole.

4. The electronic device of claim 1 wherein said terminal pin is plated with a conductive material.

5. The electronic device of claim 4 wherein said terminal pin is plated with one of a tin, a nickel and a tin/lead alloy.

6. The electronic device of claim 1 wherein said substrate is fabricated of polyimide material.

7. The electronic device of claim 1 wherein said substrate is fabricated to polyester material.

8. An electronic device, comprising:
 a flat flexible dielectric substrate less than 0.050 inch thick and having a generally round hole of a given diameter;
 a ductile conductive film on the substrate in an area at least about said hole;
 a substantially square terminal pin having rounded corners inserted into the round hole in the substrate, the square pin having a given cross-dimension between opposite corners thereof greater than the diameter of the round hole, and at least the insertion end of the terminal pin being plated with a conductive material; and
 wherein the difference between the cross-dimension of the square pin and the diameter of the round hole is on the order of 7% to 67% of the diameter of the hole
 and wherein an improved electrical and mechanical interface is created between the terminal pin and the conductive film in the area about said hole such that a deformed peripheral area of the flat flexible substrate applies normal forces to the square pin.

9. The electronic device of claim 8 wherein said terminal pin is plated with one of a tin, a nickel, and a tin/lead alloy.

10. The electronic device of claim 9 wherein said ductile conductive film is plated with a tin/lead or tin material.

11. The electronic device of claim 8 wherein said ductile conductive film and said terminal pin are plated with a common conductive plating material.

12. An electronic device, comprising:
 a flat flexible dielectric substrate less than 0.050 inch thick and having a generally round hole of a given diameter;
 a polygonal terminal pin having rounded corners inserted into the round hole in the substrate, the polygonal pin having a given cross-dimension between substantially opposite corners thereof greater than the diameter of the round hole; and
 wherein the difference between the cross-dimension of the polygonal pin and the diameter of the round hole is on the order of 7% to 67% of the diameter of the hole
 and wherein an improved electrical and mechanical interface is created between the terminal pin and the flat flexible substrate in the area about said hole such that a deformed peripheral area of the flat flexible substrate applies normal forces to the pin.

13. The electronic device of claim 10, including a ductile conductive film on the substrate in an area at least about said hole.

14. The electronic device of claim 13 wherein said ductile conductive film and said terminal pin are plated with a common conductive plating material.

15. The electronic device of claim 12 wherein said terminal pin is plate with a conductive material.

16. The electronic device of claim 15 wherein said terminal pin is plated with one of a tin, a nickel, and a tin/lead alloy.

* * * * *